United States Patent [19]

Farassat

[11] Patent Number: 5,452,838
[45] Date of Patent: Sep. 26, 1995

[54] BONDING HEAD FOR AN ULTRASONIC BONDING MACHINE

[75] Inventor: Farhad Farassat, Taufkirchen, Germany

[73] Assignee: F & K Delvotec Bondtechnik GmbH, Germany

[21] Appl. No.: 165,698

[22] Filed: Dec. 10, 1993

[30] Foreign Application Priority Data

Jul. 13, 1993 [DE] Germany ............... 43 23 431.3
Aug. 6, 1993 [DE] Germany ............... 43 26 478.6

[51] Int. Cl.⁶ ................................................ B23K 20/10
[52] U.S. Cl. ................... 228/1.1; 228/4.5; 228/13
[58] Field of Search ..................... 228/1.1, 4.5, 13

[56] References Cited

U.S. PATENT DOCUMENTS

| | | | |
|---|---|---|---|
| 3,718,272 | 2/1973 | Eltzroth et al. | 228/1.1 |
| 4,068,371 | 1/1978 | Miller | 228/4.5 |
| 4,619,397 | 10/1986 | Urban | 228/1.1 |
| 4,781,319 | 11/1988 | Deubzer et al. | 228/1.1 |
| 4,789,093 | 12/1988 | Bansemir | 228/1.1 |
| 4,976,392 | 12/1990 | Smith et al. | 228/1.1 |

Primary Examiner—Mark Rosenbaum
Assistant Examiner—Jeffrey T. Knapp
Attorney, Agent, or Firm—Hale and Dorr

[57] ABSTRACT

A bonding head for an ultrasonic bonding machine comprises a wedge operatively associated with an ultrasound transducer by means of which an electrically conducting wire can be pressed against a contact surface of an electrical or electronic component and bonded thereto by ultrasonic excitation of the wedge. A wire clamp is located adjacent to and ahead of the wedge and can be moved back and forth by drive means in the direction of the wire being fed to the wedge. The wedge can be moved up and down together with the wire clamp and its drive means in a direction substnatially perpendicular to the contact surface. The bonding head as a whole is also disposed so that it can be swung about an axis perpendicular to the contact surface. The drive means for wire clamp comprises a translational drive which can move the wire clamp exactly parallel to the direction of the wire being fed to the wedge.

8 Claims, 1 Drawing Sheet

BONDING HEAD FOR AN ULTRASONIC BONDING MACHINE

FIELD OF THE INVENTION

The present invention relates to a bonding head of the type used in an ultrasonic wedge bonding machine.

DESCRIPTION OF THE PRIOR ART

In a wedge bonding machine for ultrasonic bonding, a wedge operatively associated with an ultrasound transducer is used to press an electrically conducting wire, typically aluminum wire, against a contact surface of an electrical or electronic component and bond it thereto under ultrasonic excitation. A wire clamp is positioned ahead of the wedge and the wedge together with the wire clamp and its driving mechanisms can be moved up and down approximately perpendicular to the contact surface. The bonding head as a whole is also so disposed as to be rotatable about an axis perpendicular to the contact surface.

A bonding head of this type is described in U.S. Pat. No. 4,202,482. The bonding head described herein is distinguished by the fact that the wire clamp positioned ahead of the wedge is so disposed as to be rotatable about a horizontal axis, with the consequence that as the wire is advanced, both bending torques and transverse forces are exerted on the wire. That is, the part of the wire gripped by the wire clamp must follow the circular movement made by the wire clamp or the jaws of the clamp. This results in abrasion of the wire in the wedge bore through which the wire is guided to the contact surface. After a relatively brief period of operation, the abrasion of the wire within the wedge bore causes increased frictional resistance, with the consequence that it is no longer possible to form a good wire loop with the apparatus.

SUMMARY OF THE INVENTION

The object of the present invention is to overcome or substantially mitigate the problem of increased frictional resistance in the wedge bore.

According to a first aspect of the present invention there is provided a bonding head for an ultrasonic bonding machine comprising a wedge for pressing and bonding wire to a contact surface by ultrasonic excitation, a transducer for ultrasonic excitation of the wedge, a wire clamp located adjacent the wedge for releasably clamping wire being fed to the wedge, first means for moving the wedge and the wire clamp up and down in a direction substantially perpendicular to the contact surface, second means for rotating the bonding head as a whole about an axis perpendicular to the contact surface, and a first translational drive means for moving the wire clamp back and forth in a direction parallel to the direction of the wire being fed to the wedge.

Thus, the translational drive means moves the wire clamp exactly parallel to the bonding wire so that in this invention the wire no longer makes any circular movement. The wire is introduced into the wedge bore exactly parallel to the longitudinal direction of this bore. Wire abrasion is thereby kept to a minimum, with the consequence that even after prolonged operation there is no increase in the friction resistance between the bonding wire and wedge bore, and wire loops can continue to be produced with no deterioration in their quality. Furthermore, a constant tail length is also ensured over a long period of operation of the bonding head.

Preferably, the bonding head comprises a flexible tube within which the wire can be located and thereby guided to the wire clamp.

This feature further protects the wire against wear and an additional benefit of this arrangement is that the wire is not deflected either upward or downward before being gripped by the wire clamp and hence does not, as a result of such deflection, adopt a position wherein it cannot be properly gripped, or gripped at all, by the wire clamp.

Preferably also, the bonding head comprises a third means for rotating the transducer and the wedge about an axis which is parallel to the contact surface and perpendicular to the longitudinal axes respectively of the transducer and the wedge, said third means comprising a means for generating a magnetic field giving rise to a force in a first direction which acts against an opposing force generated by a spring bias so that said third means rotates the transducer and the wedge in such a way that the wedge can be lifted up from the contact surface against the force of the spring bias and thereby the contact pressure of the wedge on the contact surface is adjustable by relative variation of said forces generated by said magnetic field and said opposing spring bias.

The contact pressure or so-called "bonding weight" can thus be set and adjusted by simple constructional means. Bonding weight is understood to designate the contact pressure of the wedge i.e. the force with which the wedge presses the bonding wire against the contact surface of the electrical or electronic component.

According to a second aspect of the present invention there is provided a bonding head for an ultrasonic bonding machine comprising a wedge for pressing anti bonding wire to a contact surface by ultrasonic excitation, a transducer for ultrasonic excitation of the wedge, a wire clamp located adjacent the wedge for releasably clamping wire being fed to the wedge, first means for moving the wedge and the wire clamp up and down in a direction substantially perpendicular to the contact surface, second means for rotating the bonding head as a whole about an axis perpendicular to the contact surface, and a flexible tube within which the wire can be located and thereby guided to the wire clamp.

According to a third aspect of the present invention there is provided a bonding head for an ultrasonic bonding machine comprising a wedge for pressing and bonding wire to a contact surface by ultrasonic excitation, a transducer for ultrasonic excitation of the wedge, a wire clamp located adjacent the wedge for releasably clamping wire being fed to the wedge, first means for moving the wedge and the wire clamp up and down in a direction substantially perpendicular to the contact surface, second means for rotating the bonding head as a whole about an axis perpendicular to the contact surface, and a third means for rotating the transducer and the wedge about an axis which is parallel to the contact surface and perpendicular to the longitudinal axes respectively of the transducer and the wedge, said third means comprising a means for generating a magnetic field giving rise to a force in a first direction which acts against an opposing force generated by a spring bias so that said third means rotates the transducer and the wedge in such a way that the wedge can be lifted up from the contact surface against the force of the spring bias and thereby the contact pressure of the wedge on the contact surface is adjustable by relative variation of said forces generated by said magnetic field and said opposing spring bias.

An example of a bonding head according to the various aspects of the present invention will now be described with

DESCRIPTION OF A PREFERRED EMBODIMENT

Figure 1:
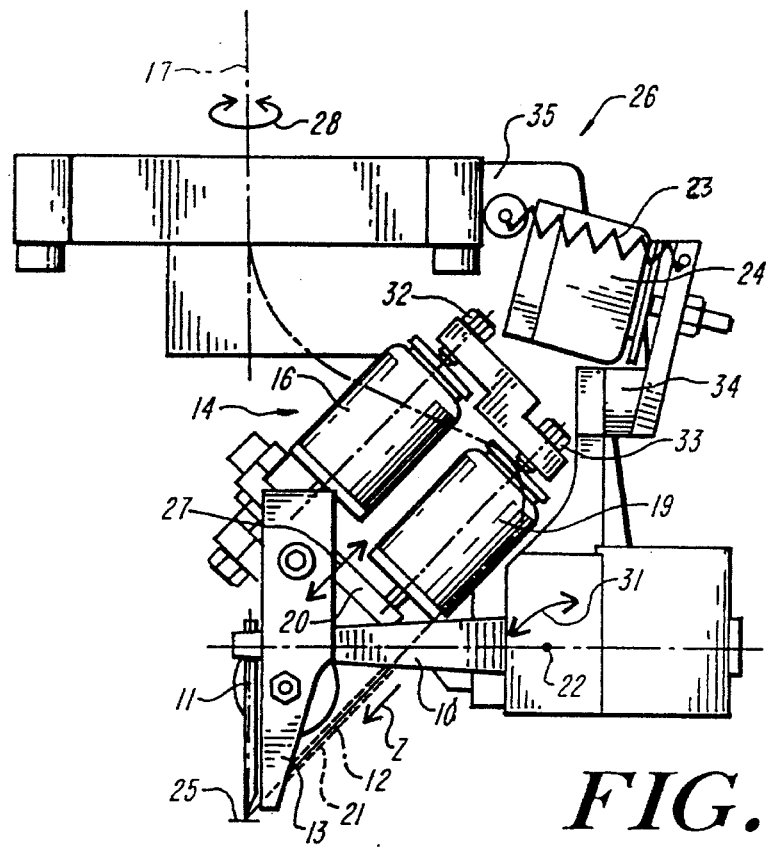
FIG. 1 is a side elevation of a bonding head according to the invention.
Figure 2:
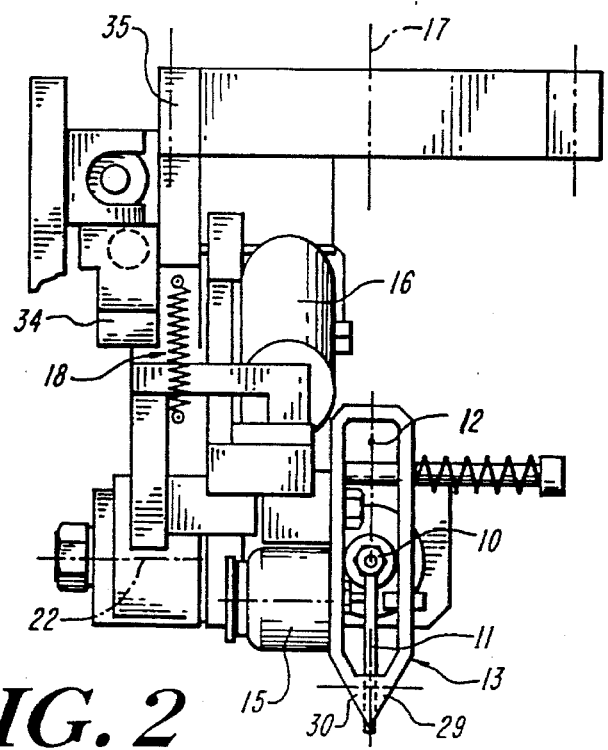
FIG. 2 is a front elevation of the bonding head shown FIG. 1.

FIGS. 1 and 2 show a bonding head 26 for an ultrasonic wedge bonding machine with a wedge 11 operatively associated with an ultrasound transducer 10, by means of which an electrically conducting wire 12, in particular aluminum wire, can be pressed against a contact surface 25 of an electrical or electronic component (not further illustrated) and bonded thereto by ultrasonic excitation. The bonding head 26 also comprises a wire clamp 13 with clamp jaws 29, 30 that is positioned adjacent and ahead of the wedge 11 and can be moved back and forth in the direction of the wire 12 as is indicated by the double-headed arrow 27 in FIG. 1. In addition, the bonding head 26 as a whole is so disposed that it can be swung about an axis 17 perpendicular to the contact surface 25. This rotational movement is indicated by the double-headed arrow 28 in FIG. 1. Furthermore, the wedge 11 can be moved up and down in a direction substantially perpendicular to the contact surface 25. For this purpose, the wedge 11 and the transducer 10 are so disposed that they can be swung about an axis 22 that extends parallel to the contact surface 25 and perpendicular to the longitudinal axes of the wedge 11 and the transducer 10. This rotational movement is indicated by the double-headed arrow 31 in FIG. 1.

A driving mechanism 14 for the back-and-forth movement 27 of the wire clamp 13 in the direction of the wire 12, i.e. parallel to the wire 12, is a translational drive 16 in the form of a solenoid, which can move the wire clamp 13 exactly in parallel to the wire 12. The solenoid 16 thereby moves the wire clamp 13 in the wire-feed direction Z, against the action of a spring bias in the form of a retracting spring 18 (see FIG. 2). Arranged in parallel to the translational drive 16 for the back-and-forth movement of the wire clamp 13 is a separate translational drive 19, also connected to the wire clamp 13, the maximally advanced position of which defines the position of the wire clamp 13 at which the wire breaks off. The translational drive 19 is also comprises a solenoid, the plunger of which, like the plunger of the translational drive 16 for the back-and-forth movement of the wire clamp 13, is connected to the latter, by way of a common connecting yoke 20. When the wire clamp 13 is moved in the wire-feed direction Z by the solenoid 16 specified for that purpose, the plunger of the solenoid 19 that defines the wire-breaking position of the wire clamp 13 is moved along with it, beyond the maximally advanced position of solenoid 19 that defines the position for breaking of the wire. To the clamp jaws 29, 30 of the wire clamp 13 is attached yet another separate drive mechanism 15, preferably also in the form of a solenoid (see FIG. 2).

In use, activation of the various drives and the movements of the wire clamp 13 thereby brought about are as follows:

1. Activation of the solenoid 15 with the consequence that the clamp jaws 29, 30 are moved into a clamping position and grip the bonding wire 12.
2. Activation of the solenoids 16 and 19 with the consequence that the wire clamp 13 is moved in the wire-feed direction Z, carrying the bonding wire 12 with it, until a so-called feed position has been reached.
3. Lowering of and ultrasonic excitation of the wedge 11, during which the wire 12 is pressed against the contact surface 25 and bonded to the latter.
4. Deactivation of the solenoid 15 and hence opening of the clamp jaws 29, 30.
5. Loop formation of the wire 12 in a conventional manner, by relative movement between the wedge 11 and the contact surface 25 of the electronic component in such a way that a new neighboring contact surface 25 is brought into association with the wedge 11, the solenoid 16 being deactivated during the loop formation with the consequence that the wire clamp 13 travels back into a position determined by the maximally advanced position of the solenoid 19.
6. Lowering of the wedge 11 onto the new contact surface 25, during which the wire 12 is pressed against and bonded to the latter, the solenoid 15 being activated during the lowering of the wedge 11 so that the wire 12 is clamped firmly between the clamp jaws 29, 30.
7. Deactivation of the solenoid 19 with the consequence that under the action of the retracting spring 18 the wire clamp 13 is jerked still further back into a null or starting position and the wire 12 simultaneously breaks directly at the bonding site, the thereby ensuing retraction of the wire 12 being adjusted so that the free end of the wire is still situated within the wedge bore after breaking of the wire has occurred. This retraction distance is also called the break-off length. The break-off length must thus be smaller than the length of the wedge bore.
8. Deactivation of the solenoid 15 with release of the wire 12 by the clamp jaws 29, 30 of the wire clamp 13. The wire clamp 13 is again in the null or starting position. A new advancement of the wire with preset tail length can now occur. The translational movement of the drives 16 and 19, and hence the so-called tail length and break-off length, respectively, can be individually adjusted by corresponding set screws 32, 33, as shown in FIG. 1.

As FIG. 1 further shows, the solenoid 19 that defines the wire-breaking position of the wire clamp 13 is offset in the wire-feed direction Z from the solenoid 16 that is responsible for feeding the wire 12.

The wire 12 is guided within a flexible tube up to a position wherein it is gripped by the wire clamp 13. This arrangement protects the wire 12 from damage. In addition, it prevents the wire 12 from moving out of the region of the clamp jaws 29, 30 of the wire clamp 13 which would prevent the jaws 29, 30 from gripping the wire 12.

The rotational movement of the wedge 11 at the transducer 10 and of the wire clamp 13 about the axis 22 is determined by the tension exerted by a draw spring 23 on one hand and tile magnetic field generated by a solenoid 24 on the other hand. The spring 23 and the solenoid 24 act between a swing component 34 and a non-rotatable component 35 of the bonding head 26. The spring 23 and the magnetic field generated by the solenoid 24 determine the contact pressure of the wedge 11, i.e. the so-called bonding weight as described previously.

What is claimed is:

1. A bonding head for an ultrasonic bonding machine comprising a wedge for pressing and bonding wire to a contact surface by ultrasonic excitation, a transducer for ultrasonic excitation of the wedge, a wire clamp located adjacent the wedge for releasably clamping wire being fed to the wedge, first means for moving the wedge and the wire clamp up and down in a direction substantially perpendicular to the contact surface, second means for rotating the bonding head as a whole about an axis perpendicular to the contact surface, and a first translational drive means for moving the wire clamp back and forth in a direction parallel to the direction of the wire being fed to the wedge, said first translational drive means comprising a first solenoid with a plunger and a retraction spring bias so that the wire clamp can be moved by the plunger in a direction parallel to the direction of the wire being fed to the wedge against the action of the spring bias.

2. A bonding head as claimed in claim 1, comprising a flexible tube within which the wire can be located and thereby guided to the wire clamp.

3. A bonding head as claimed in claim 1, comprising a third means for rotating the transducer and the wedge about an axis which is parallel to the contact surface and perpendicular to the longitudinal axes respectively of the transducer and the wedge, said third means comprising a means for generating a magnetic field giving rise to a force in a first direction which acts against an opposing force generated by a spring bias so that said third means rotates the transducer and the wedge in such a way that the wedge can be lifted up from the contact surface against the force of the spring bias and thereby the contact pressure of the wedge on the contact surface is adjustable by relative variation of said forces generated by said magnetic field and said opposing spring bias.

4. A bonding head for an ultrasonic bonding machine comprising a wedge for pressing and bonding wire to a contact surface by ultrasonic excitation, a transducer for ultrasonic excitation of the wedge, a wire clamp located adjacent the wedge for releasably clamping wire being fed to the wedge, first means for moving the wedge and the wire clamp up and down in a direction substantially perpendicular to the contact surface, second means for rotating the bonding head as a whole about an axis perpendicular to the contact surface, and a first translational drive means for moving the wire clamp back and forth in a direction parallel to the direction of the wire being fed to the wedge, a second translational drive means which is disposed in parallel to said first translational drive means and which is connected to the wire clamp, the second translational drive means having a maximally advanced position comprising a wire-breaking position of the wire clamp, said second translational drive means also including a solenoid with a plunger connected to the wire clamp, operation of said first and said second translational drive means being linked so that when the wire clamp is moved parallel to the direction of the wire being fed to the wedge by the first translational drive means the plunger of the second translational drive means is moved along with the wire clamp beyond its maximally advanced position comprising the wire-breaking position.

5. A bonding head as claimed in claim 4, wherein said first and said second translational drive means are linked by a common connecting yoke.

6. A bonding head as claimed in claim 4, comprising a third means for rotating the transducer and the wedge about an axis which is parallel to the contact surface and perpendicular to the longitudinal axes respectively of the transducer and the wedge, said third means comprising a means for generating a magnetic field giving rise to a force in a first direction which acts against an opposing force generated by a spring bias so that said third means rotates the transducer and the wedge in such a way that the wedge can be lifted up from the contact surface against the force of the spring bias and thereby the contact pressure of the wedge on the contact surface is adjustable by relative variation of said forces generated by said magnetic field and said opposing spring bias.

7. A bonding head for an ultrasonic bonding machine comprising a wedge for pressing and bonding wire to a contact surface by ultrasonic excitation, a transducer for ultrasonic excitation of the wedge, a wire clamp located adjacent the wedge for releasably clamping wire being fed to the wedge, first means for moving the wedge and the wire clamp up and down in a direction substantially perpendicular to the contact surface, second means for rotating the bonding head as a whole about an axis perpendicular to the contact surface, and a first translational drive means for moving the wire clamp back and forth in a direction parallel to the direction of the wire being fed to the wedge, said first translational drive means comprising a first solenoid with a plunger connected to the wire clamp, a second translational drive means which is disposed in parallel to said first translational drive means and which is connected to the wire clamp, the second translational drive means having a maximally advanced position comprising a wire-breaking position of the wire clamp, and the second translational drive means comprising a second solenoid with a plunger connected to the wire clamp, said second solenoid being disposed so as to be offset in the direction of the wire being fed to the wedge relative to said first solenoid.

8. A bonding head for an ultrasonic bonding machine comprising a wedge for pressing and bonding wire to a contact surface by ultrasonic excitation, a transducer for ultrasonic excitation of the wedge, a wire clamp located adjacent the wedge for releasably clamping wire being fed to the wedge, first means for moving the wedge and the wire clamp up and down in a direction substantially perpendicular to the contact surface, second means for rotating the bonding head as a whole about an axis perpendicular to the contact surface, and a third means for rotating the transducer and the wedge about an axis which is parallel to the contact surface and perpendicular to the longitudinal axes respectively of the transducer and the wedge, said third means comprising a means for generating a magnetic field giving rise to a force in a first direction which acts against an opposing force generated by a spring bias so that said third means rotates the transducer and the wedge in such a way that the wedge can be lifted up from the contact surface against the force of the spring bias and thereby the contact pressure of the wedge on the contact surface is adjustable by relative variation of said forces generated by said magnetic field and said opposing spring bias.

* * * * *